US010508942B2

(12) United States Patent
Matsumoto et al.

(10) Patent No.: US 10,508,942 B2
(45) Date of Patent: Dec. 17, 2019

(54) THERMAL FLOW METER

(71) Applicant: Hitachi Automotive Systems, Ltd., Hitachinaka-shi, Ibaraki (JP)

(72) Inventors: Masahiro Matsumoto, Tokyo (JP); Hiroshi Nakano, Tokyo (JP); Keiji Hanzawa, Hitachinaka (JP); Satoshi Asano, Tokyo (JP)

(73) Assignee: HITACHI AUTOMOTIVE SYSTEMS, LTD., Ibaraki (JP)

( * ) Notice: Subject to any disclaimer, the term of this patent is extended or adjusted under 35 U.S.C. 154(b) by 59 days.

(21) Appl. No.: 14/439,876

(22) PCT Filed: Oct. 9, 2013

(86) PCT No.: PCT/JP2013/077414
§ 371 (c)(1),
(2) Date: Apr. 30, 2015

(87) PCT Pub. No.: WO2014/069193
PCT Pub. Date: May 8, 2014

(65) Prior Publication Data
US 2015/0300858 A1   Oct. 22, 2015

(30) Foreign Application Priority Data

Nov. 2, 2012  (JP) .................................. 2012-242321

(51) Int. Cl.
*G01F 1/696* (2006.01)
*G01F 25/00* (2006.01)
*G01R 31/02* (2006.01)

(52) U.S. Cl.
CPC .......... *G01F 1/696* (2013.01); *G01F 25/0007* (2013.01); *G01R 31/025* (2013.01)

(58) Field of Classification Search
CPC .......... G01F 1/696; G01F 25/00; G01R 31/02
See application file for complete search history.

(56) References Cited

U.S. PATENT DOCUMENTS 4,550,261 A * 10/1985 Hormel ................. G01F 23/246
                                                    307/118
4,939,348 A *  7/1990 Criss ................. B32B 17/10036
                                                    219/203
(Continued)

FOREIGN PATENT DOCUMENTS

JP          5-81720 U     11/1993
JP         10-68647 A      3/1998
(Continued)

OTHER PUBLICATIONS

International Search Report, PCT/JP2013/077414, dated Jan. 21, 2014, 2 pgs.
(Continued)

*Primary Examiner* — Christopher P McAndrew
*Assistant Examiner* — Zannatul Ferdous
(74) *Attorney, Agent, or Firm* — Volpe and Koenig, P.C.

(57) ABSTRACT

In configurations in which a circuit element is connected in parallel with a resistor, it is difficult to detect a break in the two wires. A thermal flow meter includes a heating element and a temperature controlling bridge circuit that is formed of a plurality of resistors and controls the temperature of the heating element. The thermal flow meter includes: a circuit element connected in parallel with at least one resistor configuring the temperature controlling bridge circuit through two wires drawn from both ends of the resistor; a voltage detection circuit that detects that the magnitude of voltage produced between the two wires has become smaller than a first predetermined value; and a fault signal output circuit that, when it is detected at the voltage detection circuit that the. magnitude of the voltage has become smaller than the first predetermined value, outputs a signal indicating a fault.

7 Claims, 11 Drawing Sheets

(56) References Cited

U.S. PATENT DOCUMENTS

| | | | |
|---|---|---|---|
| 2007/0113643 A1* | 5/2007 | Ohtsuka | G01F 1/68 73/204.15 |
| 2007/0181554 A1 | 8/2007 | Nakano et al. | |
| 2007/0251315 A1* | 11/2007 | Sukegawa | G01F 1/696 73/204.27 |
| 2008/0233822 A1* | 9/2008 | Swallow | D03D 1/0088 442/185 |
| 2010/0170335 A1 | 7/2010 | Nakano et al. | |
| 2012/0279294 A1 | 11/2012 | Nakano et al. | |
| 2013/0093432 A1 | 4/2013 | Matsumoto et al. | |
| 2015/0300858 A1* | 10/2015 | Matsumoto | G01F 1/696 324/538 |

FOREIGN PATENT DOCUMENTS

| | | | | |
|---|---|---|---|---|
| JP | 2002-310754 A | 10/2002 | | |
| JP | 2005-156193 A | 6/2005 | | |
| JP | 4405242 B2 | 11/2009 | | |
| JP | 2011-237456 A | 11/2011 | | |
| JP | 2012-8014 A | 1/2012 | | |
| JP | 2012008014 A * | 1/2012 | | G01D 3/08 |

OTHER PUBLICATIONS

Chinese Office Action for Chinese Patent Application No. 201380056445.5 dated Apr. 18, 2017.

* cited by examiner

| WIRE | BREAKAGE DETECTION |
|------|--------------------|
| L1   | OK                 |
| L2   | OK                 |
| L3   | OK                 |
| L4   | NG                 |
| L5   | OK                 |

(Prior Art)

| WIRE | BREAK DETECTION | SHORT-CIRCUITING TO POWER SUPPLY | SHORT-CIRCUITING TO GROUND |
|---|---|---|---|
| L1 | NG | NG | NG |
| L2 | OK | OK | OK |
| L3 | OK | OK | OK |
| L4 | OK | OK | OK |
| L5 | OK | NG | – |
| L6 | OK | OK | OK |
| L7 | OK | OK | OK |

| BREAK DETECTION | OUTPUT DIGITAL VALUE |
|---|---|
| COMPARATOR 17 | 32000 |
| COMPARATOR 24 | 32001 |

THERMAL FLOW METER

TECHNICAL FIELD

The present invention relates to thermal flow meters and in particular to a thermal flow meter in which any break can be detected between a sensor element portion and an integrated circuit.

BACKGROUND ART

As a conventional example of thermal flow meters, the thermal flow rate sensor described in Japanese Patent Application Laid-Open No. 2011-237456 is known. In this example, a bridge circuit that detects heater temperature is provided with a balance adjusting resistor. The potential across the balance adjusting resistor is taken out and this end-to-end potential is received by resistors connected in series in multiple stages. An intermediate potential produced between a resistor and a resistor connected in series in multiple stages can be adjusted by changing the intermediate potential with a switch before taking it out. Even when the resistance value of a resistive element configuring the bridge circuit, the balance of the bridge circuit can be adjusted.

In the break detection circuit of a bridge circuit described in Japanese Patent Application Laid-open No. 2012-008014, a first series circuit made up of two resistors and a second series resistance made up of two resistors are connected in parallel to form a bridge circuit. A wire connects a first output terminal for taking out an intermediate potential of the first series circuit with an amplifier; and another wire connects a second output terminal for taking out an intermediate potential of the second series circuit with an amplifier. These wires are respectively connected, to the ground potential through a resistor. When a break occurs in the first output terminal, the first output terminal is brought to the ground potential. When a break occurs in the second output terminal, the second output terminal is brought to the ground potential. Thus a break of the first output terminal and the second output terminal can be detected.

CITATION LIST

Patent Literature

PTL 1: Japanese Patent Application Laid-open No. 2011-237456
PTL 2: Japanese Patent Application Laid-open No. 2012-008014

SUMMARY OF INVENTION

Technical Problem

The conventional example in Japanese Patent Application Laid-open No, 2011-237456 does not give consideration to break detection in a wire between a bridge circuit provided in a sensor element and a drive circuit for the bridge circuit. The conventional example in Japanese Patent Application Laid-Open No. 2012-008014 does not give consideration to break detection in a wire for taking out the end-to-end potential of a balance adjusting resistor.

An explanation will be given to problems involved in the conventional examples with reference to FIG. 4. FIG. 4 illustrates the configuration of a thermal flow meter as a comparative example for the explanation of the problems. This thermal flow meter is configured of a sensor element portion 1 and an integrated circuit 14. The following members are placed in the sensor element portion 1: a heating element 2; a heater temperature detecting bridge circuit 3 composed of a heater temperature detecting resistor 4 whose resistance value varies according to the temperature of the heating element 2, fixed: resistors 5, 6, 8, and a balance adjusting resistor 7; and a temperature difference detecting bridge circuit 9. The temperature difference detecting bridge circuit 9 is composed of temperature detecting resistors 10, 13 placed on the windward side of the heating element 2 and temperature detecting resistors 11, 12 placed on the leeward side of the heating element 2. The temperature difference detecting bridge circuit 9 detects a temperature difference between the windward side and leeward side of the heating element 2. The following members are placed in the integrated circuit 14: a tapped adjusting resistor 15 that takes out the intermediate potential of the end-to-end voltage of the balance adjusting resistor 7; an amplifier 16; a reference voltage source 18 that supplies reference voltage Vref to the temperature difference detecting bridge circuit 9; and an amplifier 19 that amplifies the output of the temperature difference detecting bridge circuit 9 to generate a sensor output. The amplifier 16 detects a voltage difference between the tap voltage Vt of the tapped adjusting resistor 15 and the voltage $V_{45}$ between the heater temperature detecting resistor 4 and the fixed resistor 5. The amplifier 16 then generates drive voltage Vh to the heating element 2.

It is difficult for the break detection circuit in Japanese Patent Application Laid-Open No. 2012-008014 to take out the voltage across the balance adjusting resistor 7 and detect a break in wires L2, L3 connected to the integrated circuit 14.

For example, a high resistance is connected between the wire L4 and the ground in FIG. 4. In this case, when the wire L4 is broken, the potential of the wire L4 on the integrated circuit 14 side is brought to the ground potential. This can be utilized to detect the break in the wire L4. However, in cases where a high resistance is connected between the wire L2 and the ground, a problem arises. When the wire L2 is broken, the potential of the wire L2 on the integrated circuit 14 side is fixed at the potential of the wire L3 through the wire L3 and the tapped adjusting resistor 15. In this case, the tap position of the tapped adjusting resistor 15 is irrelevant. For this reason, the potential of the wire L2 on the integrated circuit 14 side is not brought to the ground potential and the input voltage of the amplifier 16 becomes equal to the potential of the wire L3. Therefore, a break in the wire L2 cannot be detected by the conventional break detection method. This varies the balance of the heater temperature detecting bridge circuit 3 and inaccurate flow rate detection is continuously carried out. Also as for a break in the wire L3, break detection cannot be carried out as in the wire L2.

A configuration makes it impossible to detect a break in a wire connecting a bridge circuit and an amplifier with each other. In this configuration, a circuit element is connected in parallel with a resistor configuring the bridge circuit and input voltage to the amplifier is taken out through the circuit element.

The present invention has been made in consideration of the foregoing. It is an object of the present invention to enable break detection in a configuration in which a circuit element is connected between wires for taking out the end-to-end voltage of a resistor configuring a bridge circuit. The break detection is carried out in the wires for taking out the end-to-end voltage of the resistor configuring the bridge circuit.

Solution to Problem

To solve the above problems, a thermal flow meter of the present invention is provided with: a heating element; and a temperature controlling bridge circuit that is configured of a plurality of resistors and controls the temperature of the heating element. The thermal flow meter controls the temperature of the heating element and detects the flow rate of a fluid. The thermal flow meter includes: a circuit element connected in parallel with at least one resistor configuring the temperature controlling bridge circuit through two wires drawn from both ends of the resistor; a voltage detection circuit that detects that the magnitude of voltage generated between the two wires has become smaller than a first predetermined value; and a fault signal output circuit that, when it is detected at the voltage detection circuit that the magnitude of the voltage has become smaller than the first predetermined value, outputs a signal indicating a fault.

Advantageous Effects of Invention

According to the present invention, it is possible to detect a break in a wire which is difficult for the heater temperature detecting bridge circuit of a thermal flow meter to detect and thus provide a reliable thermal flow meter.

DESCRIPTION OF EMBODIMENTS

Hereafter, a description will be given to embodiments of the present invention with reference to the drawings.

Figure 1:
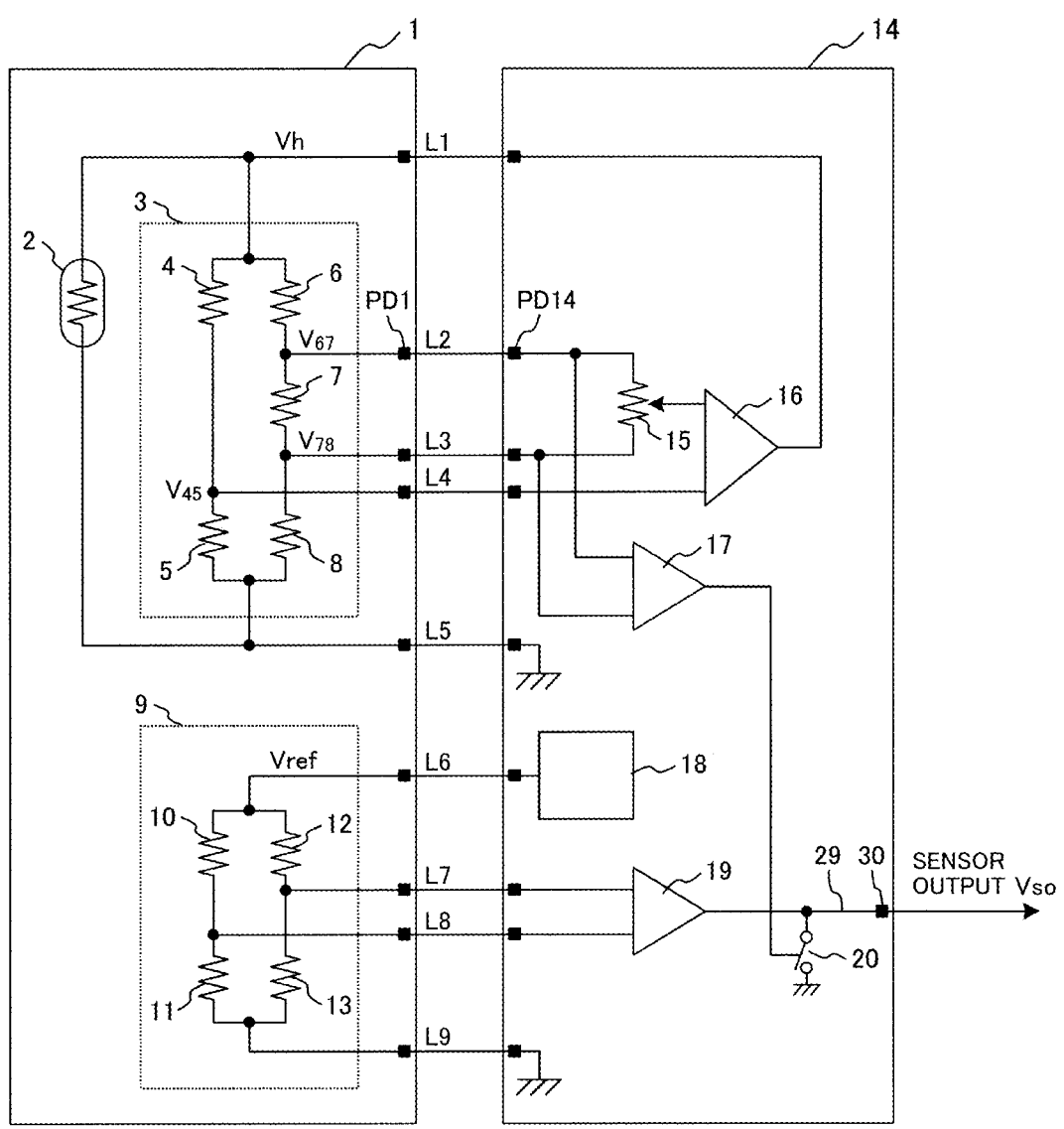
FIG. 1 is a drawing illustrating the configuration of a thermal flow meter in a first embodiment.
Figures 2, 3:
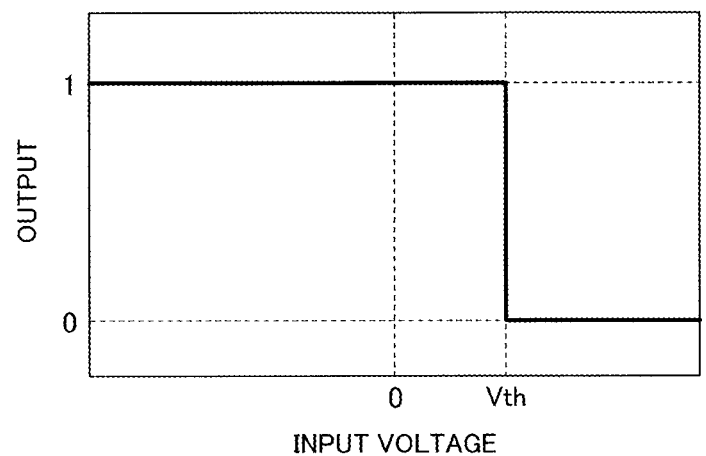
FIG. 2 is a drawing showing the input/output characteristics of a comparator 17.
FIG. 3 is a truth table showing a break detecting function.

A description will be given to a thermal flow meter in a first embodiment of the present invention with reference to FIGS. 1, 2, and 3. FIG. 1 illustrates the configuration of a thermal flow meter in the first embodiment; FIG. 2 shows the input/output characteristics of a comparator 17; and FIG. 3 is a truth table showing a break detecting function.

Figure 4:
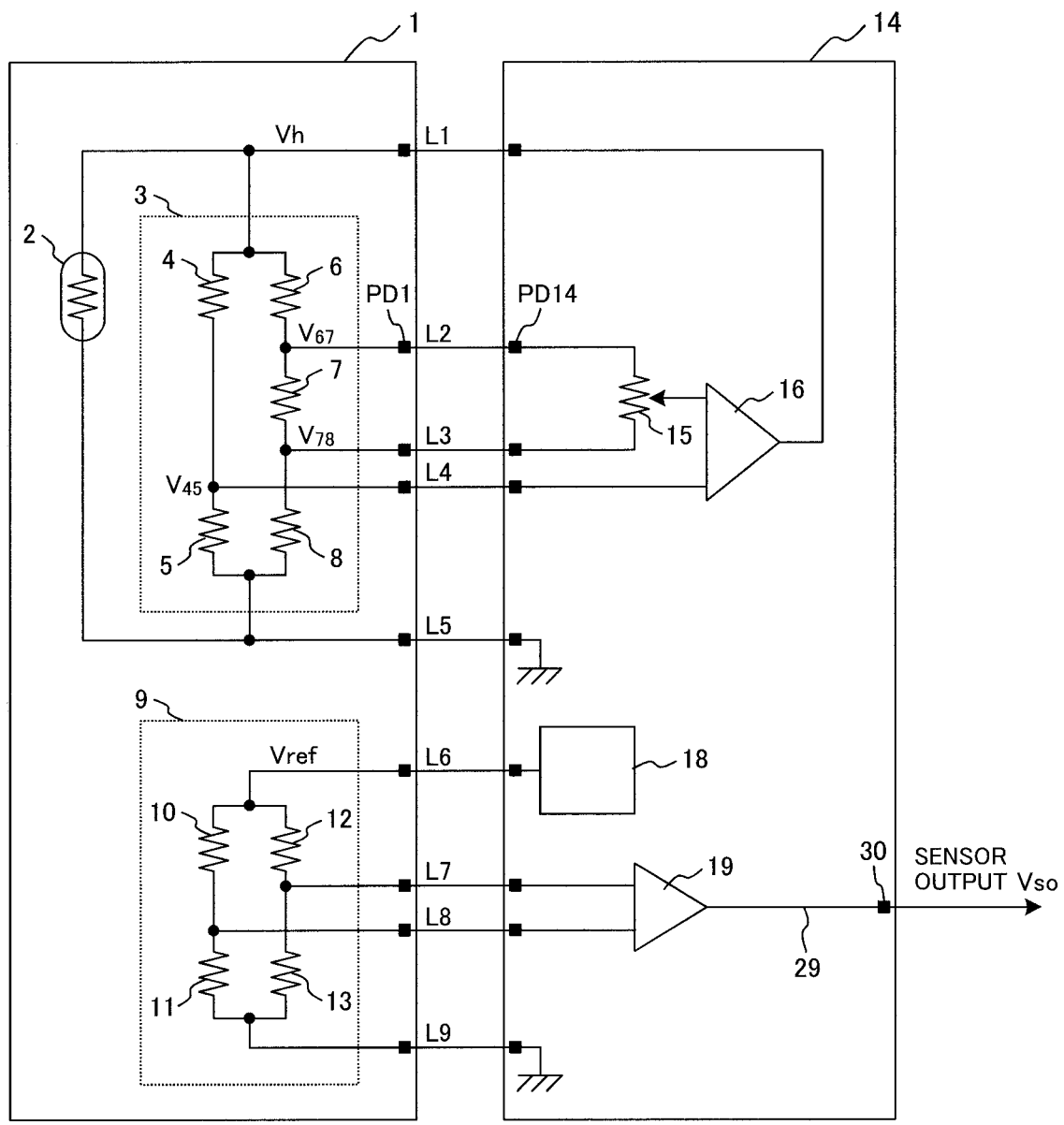
FIG. 4 is a drawing illustrating the configuration of a thermal flow meter as a comparative example for the explanation of a problem to be solved by the present invention.

The thermal flow meter in this embodiment is basically identical in configuration with the comparative example shown in FIG. 4 except that the comparator 17 and a switch 20 are added. Hereafter, a detailed description will be given.

In this embodiment, the thermal flow meter is configured of a sensor element portion 1 and an integrated circuit 14. In the sensor element portion 1, the following members are placed: a heating element 2; a heater temperature detecting bridge circuit 3 composed of a heater temperature detecting resistor 4 whose resistance value varies according to the temperature of the heating element 2, fixed resistors 5, 6, 8, and a balance adjusting resistor 7; and a temperature difference detecting bridge circuit 9 composed of temperature detecting resistors 10, 13 placed on the windward side of the heating element 2 and temperature detecting resistors 11, 12 placed on the leeward side of the heating element 2. The temperature difference detecting bridge circuit 9 detects a temperature difference between the windward side and leeward side of the heating element 2. In the integrated circuit 14, the following members are placed: a tapped adjusting resistor 15 that takes out the intermediate potential Vt of the end-to-end voltage of the balance adjusting resistor 7; an amplifier (differential amplifier) 16; a comparator 17 that detects whether or not the voltage between a wire L2 and a wire L3 connected to both ends of the balance adjusting resistor 7 is equal to or lower than a first predetermined value; a reference voltage source 18 that supplies the temperature difference detecting bridge circuit 9 with reference voltage Vref; an amplifier (differential amplifier) 19 that amplifies the output of the temperature difference detecting bridge circuit 9 to generate a sensor output; and a switch 20 that fixes the output voltage of the amplifier 19 at the ground potential. The amplifier (differential amplifier) 16 detects a voltage difference between the tap voltage Vt of the tapped adjusting resistor 15 and the voltage $V_{45}$ between the heater temperature detecting resistor 4 and the fixed resistor 5. The amplifier 16 then generates drive voltage Vh to the heating element 2.

In this application, the term "intermediate voltage" (also referred to as "intermediate potential" sometimes) does not mean the median value between two potentials. The term means a voltage or a potential within a range between two potentials. Therefore, an intermediate voltage or an intermediate potential may be a voltage or a potential deviating from a median value.

Under normal conditions, the input voltage of the comparator 17 is determined by the drive voltage Vh of the heating element 2, the fixed resistors 6, 8, the balance adjusting resistor 7, and the tapped adjusting resistor 15. That is, the input voltage of the comparator 17 is a voltage within a predetermined range. This voltage within the predetermined range has a voltage value between voltage $V_{67}$ and voltage $V_{78}$. The voltage $V_{67}$ is lower than the drive voltage Vh by an amount equivalent to a voltage produced at the junction between the fixed resistor 6 and the balance adjusting resistor 7. The voltage $V_{78}$ is higher than the ground potential by an amount equivalent to a. voltage produced at. the fixed resistor 8. This voltage value is determined by the tap position of the tapped adjusting resistor 15.

When the wire L2 or the wire L3 is broken, the input voltage of the comparator 17 is short-circuited by the tapped adjusting resistor 15 and thus the input voltage of the comparator 17 is zeroed. That is, when two inputs of the comparator 17 are connected by the tapped adjusting resistor 15 and the wire L2 or the wire L3 is broken, the two inputs of the comparator 17 are brought to an identical potential.

Therefore, when the input voltage of the comparator 17 becomes equal to lower than a first predetermined value Vth as shown in FIG. 2, it is determined that the wire L2 or the wire L3 is broken. The comparator 17 then brings the output to 1. The comparator 17 configures a voltage detection circuit that detects that the magnitude of voltage between the wire L2 and the wire L3 has become equal to or smaller than the first predetermined value.

A configuration makes it impossible to detect a break in the wires L2, L3 connecting the bridge circuit 3 and the amplifier 16 with each other. In this configuration, a circuit element (tapped adjusting resistor 15) is connected in parallel to a resistor (balance adjusting resistor 7) configuring the bridge circuit 3; and input voltage to the amplifier 16 is taken out through the circuit element. In this embodiment, the tapped adjusting resistor 15, an element composed of a plurality of resistors connected in series in multiple stages and a switch, or the like can be used as the circuit element. This circuit element is used to adjust the balance of the bridge circuit.

In the sensor element portion 1, a terminal for taking out voltage $V_{67}$ is formed as a pad PD1. Also in the integrated circuit portion 14, a pad PD14 is formed as a terminal. The pad PD1 and the pad PD14 are electrically connected with each other through the wire L2. In general, a gold wire or an aluminum wire is used for the wire L2 and the pad PD1 and the pad PD14 are wire-bonded with each other. Also as for the other wires L1, L3 to L9 and wires L10 to L12 in other embodiments, the pad PD1 is formed on the sensor element portion 1 side and the pad PP14 is formed on the integrated circuit portion 14 side, the pad PD1 and the pad PD14 being wire-bonded with each other.

A break in a wire often occurs in a wire portion (wire-bonded wire portion) connecting the pad PD1 and the pad PD14 with each other. In this embodiment and other embodiments, it is possible to reliably detect a break in a wire portion connecting the pad PD1 and the pad PD14 with each other.

When the output of the comparator 17 is brought to 1, the sensor output $V_{SO}$ is fixed at the ground potential by the switch 20. This makes it possible to indicate a fault to the controller side that receives the sensor output of the thermal flow meter. A fault may be indicated to the controller side by connecting the switch 20 to the power supply side to fix the sensor output $V_{SO}$ at the power supply potential. A signal indicating a fault due to a break is outputted from an output terminal 30 to a higher-level controller through an output signal line 29 for outputting a flow rate signal (sensor output $V_{SO}$). The switch 20 configures a fault signal output circuit that outputs a signal indicating a fault.

In the description of this embodiment, break detection in the wire L2 and the wire L3 is referred to. As shown in FIG. 3, a break in the wire L1 and the wire L5 can also be detected. In FIG. 3, "OK" indicates that break detection is feasible and "NG" indicates that break detection is infeasible. When the wire L1 is broken, the heater temperature detecting bridge circuit 3 is not supplied with drive voltage Vh; therefore, the voltage between the wire L2 and the wire L3 is zeroed and the input voltage of the comparator 17 becomes equal to or lower than the predetermined value Vth. Also when the wire L5 is broken, the voltage between the wire L2 and the wire L3 is zeroed; therefore, the input voltage of the comparator 17 becomes equal to or lower than the predetermined value Vth. Aside from the foregoing, also when the amplifier 16 becomes faulty and the drive voltage Vh is zeroed, the fault can be detected.

Since in this embodiment, the voltage between the wire L2 and the wire L3 is just detected with the comparator 17, the bridge circuit is not affected at all. In such a break detection method as described in Japanese Patent Application Laid-Open No. 2012-8014, it is necessary to pass a current through a bridge circuit for break detection. This variation in current can have influence on the balance of the bridge circuit. In this embodiment, it is unnecessary to pass a current through a bridge circuit for break detection and the balance of the bridge circuit is not affected.

Figure 5:
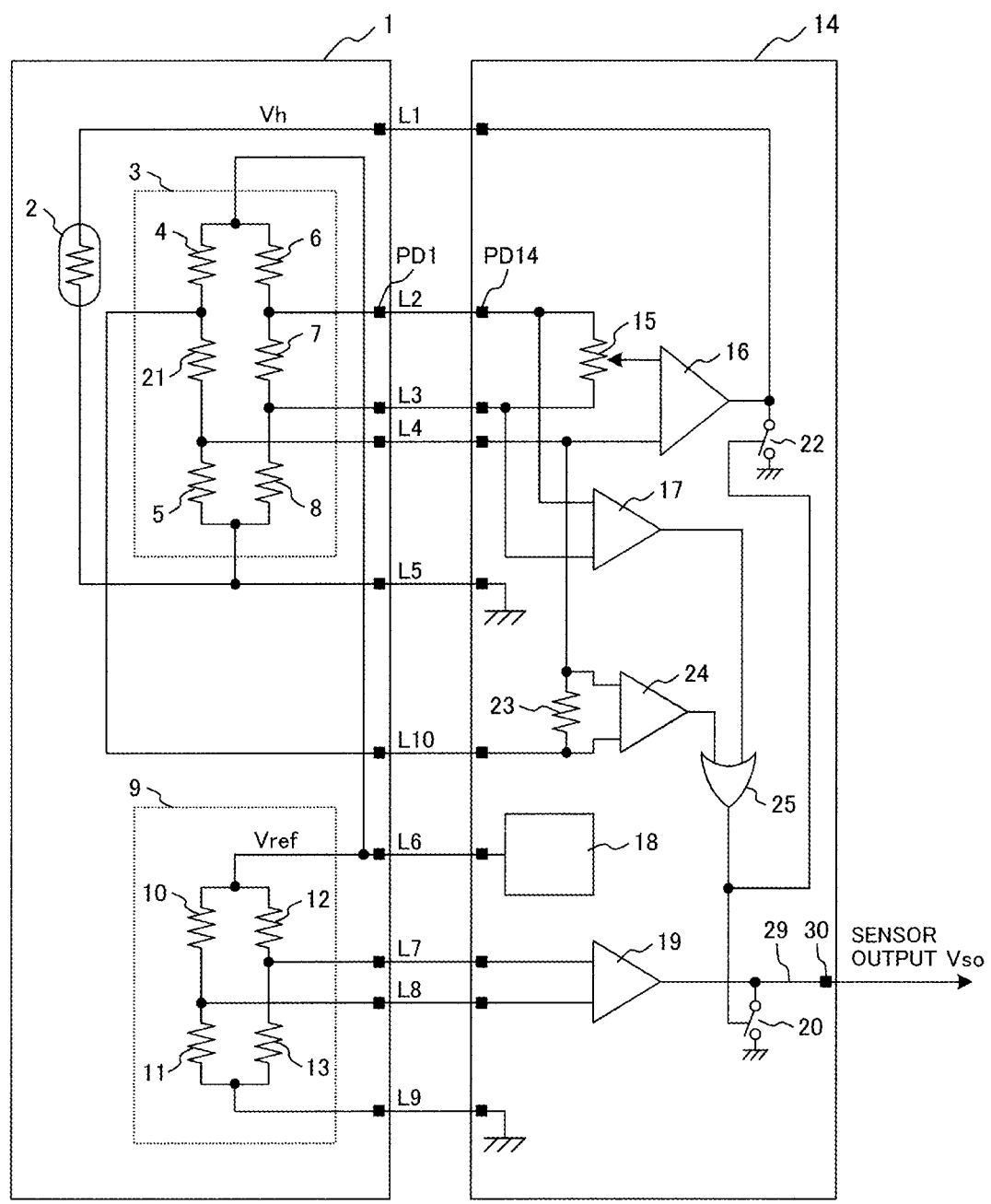
FIG. 5 is a drawing illustrating the configuration of a thermal flow meter in a second embodiment.
Figures 6, 7:
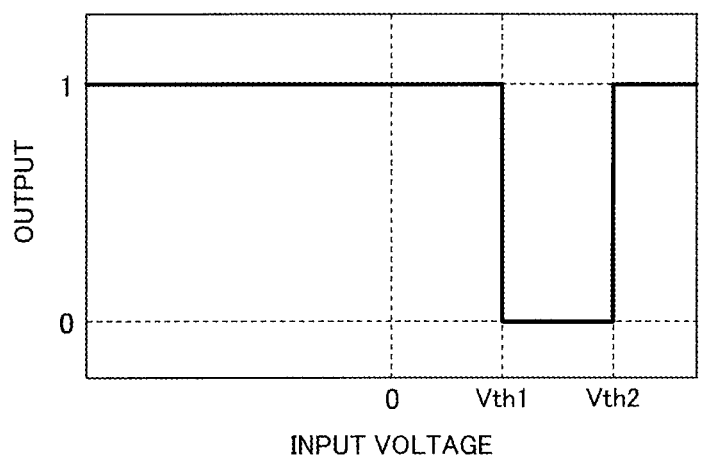
FIG. 6 is a drawing showing the input/output characteristics of comparators 17, 24.
FIG. 7 is a truth table showing a break detecting function.

A description will be given to a thermal flow meter in a second embodiment of the present invention with reference to FIGS. 5, 6, and 7. FIG. 5 illustrates the configuration of a thermal flow meter in the second embodiment; FIG. 6 shows the input/output characteristics of comparators 17, 24; and FIG. 7 is a truth table indicating a break detecting function.

The thermal flow meter in the second embodiment is basically identical in configuration with the thermal flow meter in the first embodiment. In the configuration of this embodiment, however, the operation of the comparator 17 is modified and a fixed resistor 21, a switch 22, a fixed resistor 23, the comparator 24, and an OR-circuit 25 are added. In this embodiment, the fixed resistor 21 is provided on the left part side of the heater temperature detecting bridge circuit 3 and the fixed resistor 23 is placed in parallel with the fixed resistor 21 in the integrated circuit 14. Thus the end-to-end voltage of the fixed resistor 21 can be detected with the comparator 24. The comparators 17, 24 are provided with band-type comparison characteristics as shown in FIG. 6 and 1 (signal indicating a fault) is outputted on occasions when: the input voltages of the comparators 17, 24 are equal to or lower than a first predetermined value Vth1; and when the input voltages are equal to or higher than a second predetermined value Vth2. The logical sum of the outputs of the comparators 17, 24 is determined at the OR-circuit 25. As a result, when a fault determination signal is outputted at the comparator 17 or the comparator 24, the sensor output is fixed at the ground potential by the switch 20. Further, the heater drive voltage Vh is fixed at the ground potential by the switch 22. In addition, a modification has been made so that power to the heater temperature detecting bridge circuit 3 is supplied from the reference voltage source 18 that generates a certain voltage.

In this embodiment, when the wire L4 is broken, the input voltage of the comparator 24 is zeroed and becomes lower than the predetermined voltage because the input voltage of the comparator 24 is connected with the fixed resistor 23. For this reason, the break in the wire L4 can be detected by detecting this voltage change with the comparator 24. Also as for the wire L6, detection can be carried out. This enables break detection in the wire L4 that is impossible in the first embodiment. In this embodiment, the right part and left part of the heater temperature detecting bridge circuit 3 can be made identical in circuitry and thus the symmetry of the heater temperature detecting bridge circuit 3 can be enhanced. Use of the reference voltage source 18 as the power supply to the heater temperature detecting bridge circuit 3 makes it possible to reduce variation in the following voltages: voltage between the wire L2 and the wire L3 and variation in voltage between the wire L4 and the wire L6 under normal conditions. Further, the detection accuracy of the comparators 17, 24 can be enhanced. As the result of providing the comparators 17, 24 with band-type characteristics, various faults can be detected as shown in FIG. 7. Such faults include abnormal voltage in the reference voltage source 18 and faults of short-circuiting of the wires L2, L3, L4, and L6 to the power supply or the ground. When a fault is detected, the heater drive voltage Vh is fixed at the ground potential by the switch 22 and heating control on the heating element 2 is thereby stopped. This is intended to prevent excessive voltage from being applied to the heating element 2 when a fault occurs and it is not always necessary to fix the heater drive voltage Vh at the ground potential. It only has to be possible to keep the heater drive voltage Vh at a low voltage. However, fixing the heater drive voltage Vh at the ground potential can suppress power consumed at the heating element 2 more.

A switch 22 that fixes heater drive voltage Vh at the ground potential when a fault is detected may be applied to the embodiments described later as well as the first embodiment. When a fault is detected, heating control on the heating element 2 is thereby stopped. The configuration related to the fixed resistor 21, the fixed resistor 23, the comparator 24, and the OR-circuit 25 may be applied to each embodiment described above and below as appropriate. In the above-mentioned configuration, the comparators 17, 24 are provided with band-type comparison characteristics and a signal indicating a fault is outputted on occasions: when the input voltages of the comparators 17, 24 are equal to or lower than the first predetermined value Vth1; and when the input voltages of the comparators 17, 24 are equal to or higher than the second predetermined value Vth2. This configuration may also be applied to each configuration described above and below as appropriate.

Figure 8:
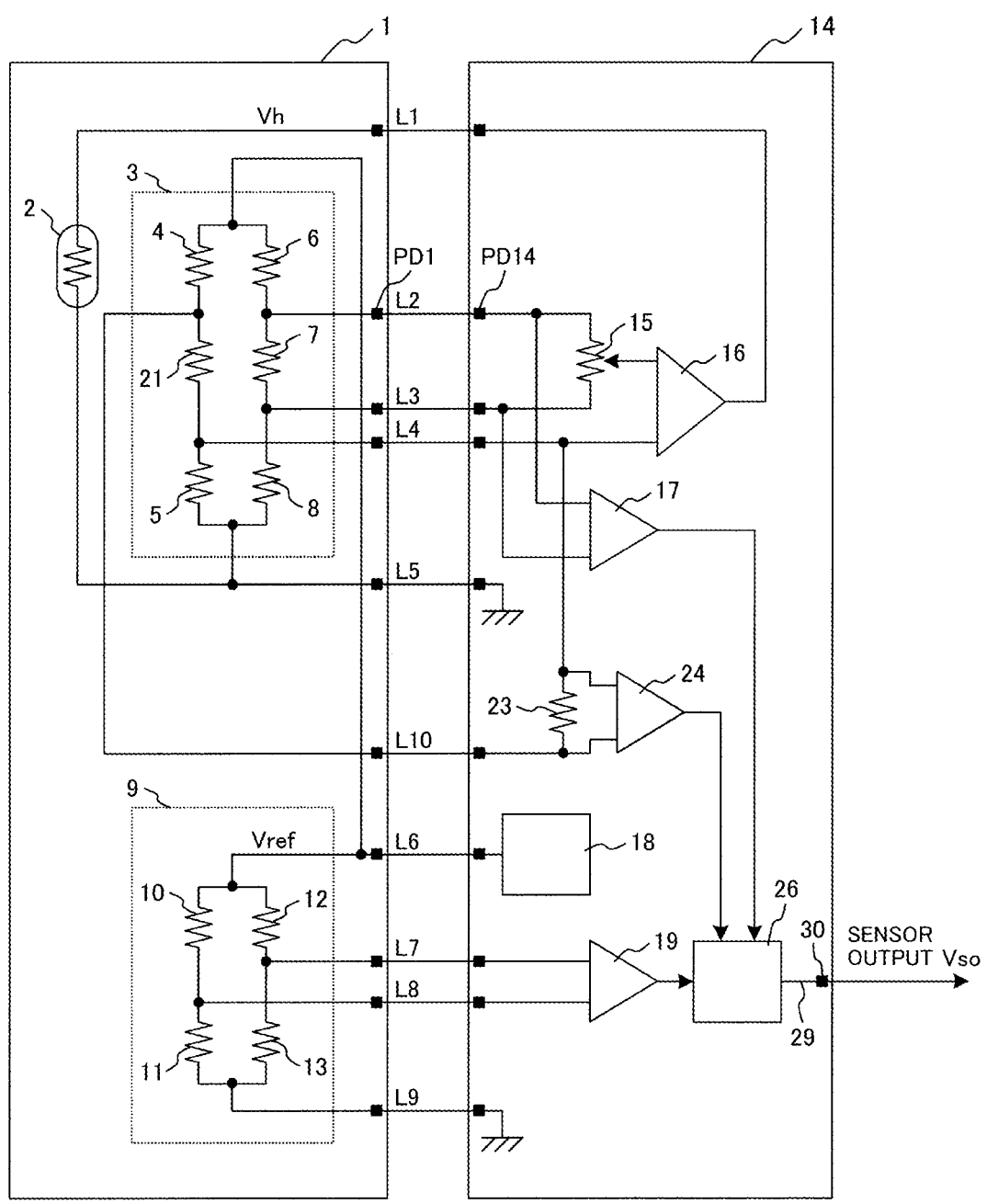
FIG. 8 is a drawing illustrating the configuration of a thermal flow meter in a third embodiment.
Figures 9, 10:
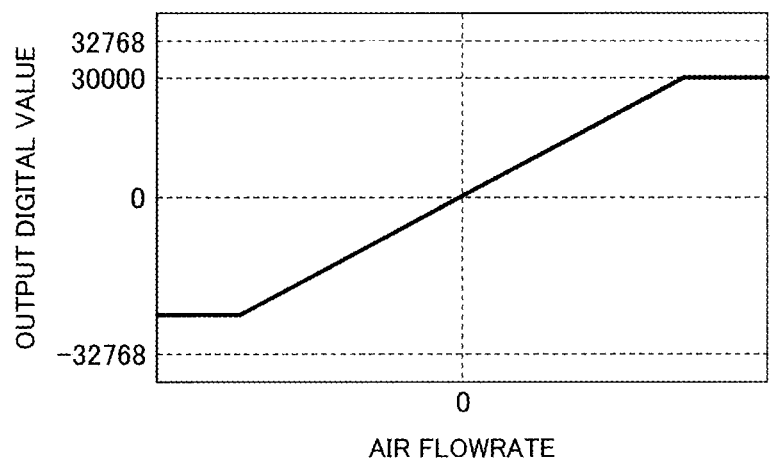
FIG. 9 is a drawing showing the output characteristic of a thermal flow meter in the third embodiment.
FIG. 10 is a drawing showing output values in break detection.

A description will be given to a thermal flow meter in a third embodiment of the present invention with reference to FIGS. 8, 9, and 10. FIG. 8 illustrates the configuration of a thermal flow meter in the third embodiment; FIG. 9 shows the output characteristic of the thermal flow meter in the third embodiment; and FIG. 10 shows output values obtained when a break is detected.

The thermal flow meter in the third embodiment is basically identical with the thermal flow meter in the second embodiment in configuration, except that a digital output circuit 26 is provided.

In this embodiment, the output of the comparator 17 and the output of the comparator 24 are inputted to the digital output circuit 26. The digital output circuit 26 receives the output of the amplifier 19 that generates sensor output $V_{SO}$, the output of the comparator 17, and the output of the comparator 24. The digital output circuit 26 then outputs sensor output $V_{SO}$, and a signal indicating a fault as a digital value. The signal indicating a fault is outputted as the output of the thermal flow meter from the output terminal 30 to a higher-level controller through the output signal line 29 for outputting flow rate signals (sensor output $V_{SO}$).

In this embodiment, the digital output circuit 26 configures a fault signal output circuit that outputs a signal indicating a fault.

In this embodiment, as shown in FIG. 9, the output value related to the flow rate obtained when the thermal flow meter is in normal operation is so set that the output value varies between −30000 and 30000. In FIG. 9, the output digital values 32768 and −32768 respectively correspond to $2^{15}$ and $-2^{15}$. As shown in FIG. 9, a free range not related to output values indicating a flow rate is present between the output digital values 30001 and 32768 and between the output digital values −30001 and −32766, Output digital values in these free ranges are used as signals indicating a fault.

When a break is detected, as shown in, for example, FIG. 10, a signal (output value) indicating a fault is set. When a break is detected at the comparator 17, the output value is fixed at 32000; and when a break is detected at the comparator 24, the output value is fixed at 32001. This makes it possible to distinctively indicate a break detected at the comparator 17 and a break detected at the comparator 24 to a higher-level controller. That is, it is possible to identify a wire involving a break in detail and indicate the wire to a higher-level controller.

The digital output circuit 26 in this embodiment may be applied to the embodiments described above and below to indicate the occurrence of a break to a higher-level controller by an output digital value.

Figure 11:
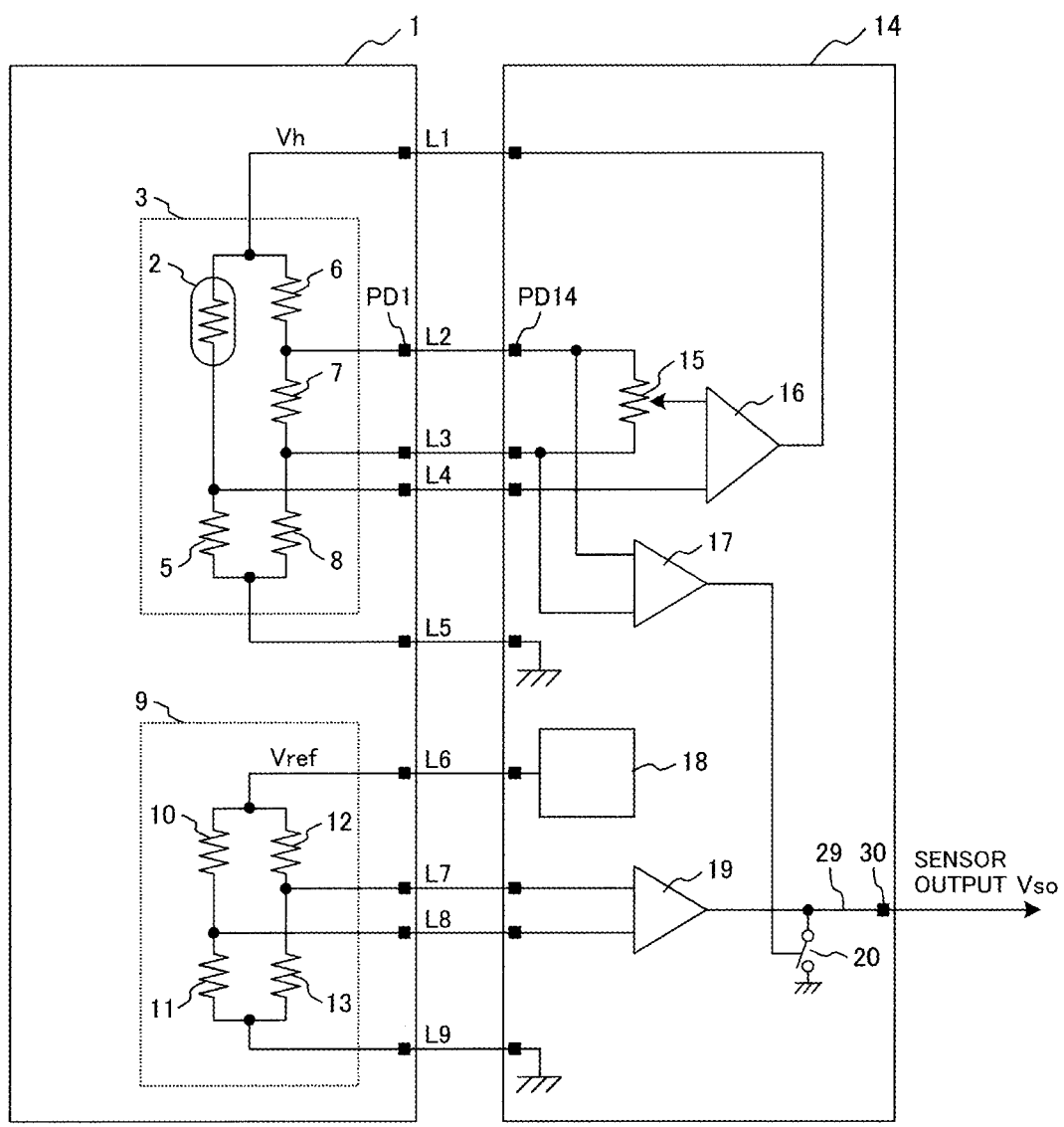
FIG. 11 is a drawing illustrating the configuration of a thermal flow meter in a fourth embodiment.

A description will be given to a thermal flow meter in a fourth embodiment of the present invention with reference to FIG. 11. FIG. 11 illustrates the configuration of a thermal flow meter in the fourth embodiment.

The thermal flow meter in the fourth embodiment is basically identical with the thermal flow meter in the first embodiment in configuration, except that the heater temperature detecting bridge circuit 3 is composed of the heating element 2, the fixed resistors 5, 6, 8, and the balance adjusting resistor 7. In this embodiment, the heater temperature detecting resistor 4 is replaced with the heating element 2. Also in this embodiment, breaks in the wire L2 and the wire L3 can be detected as in the first embodiment.

Figure 12:
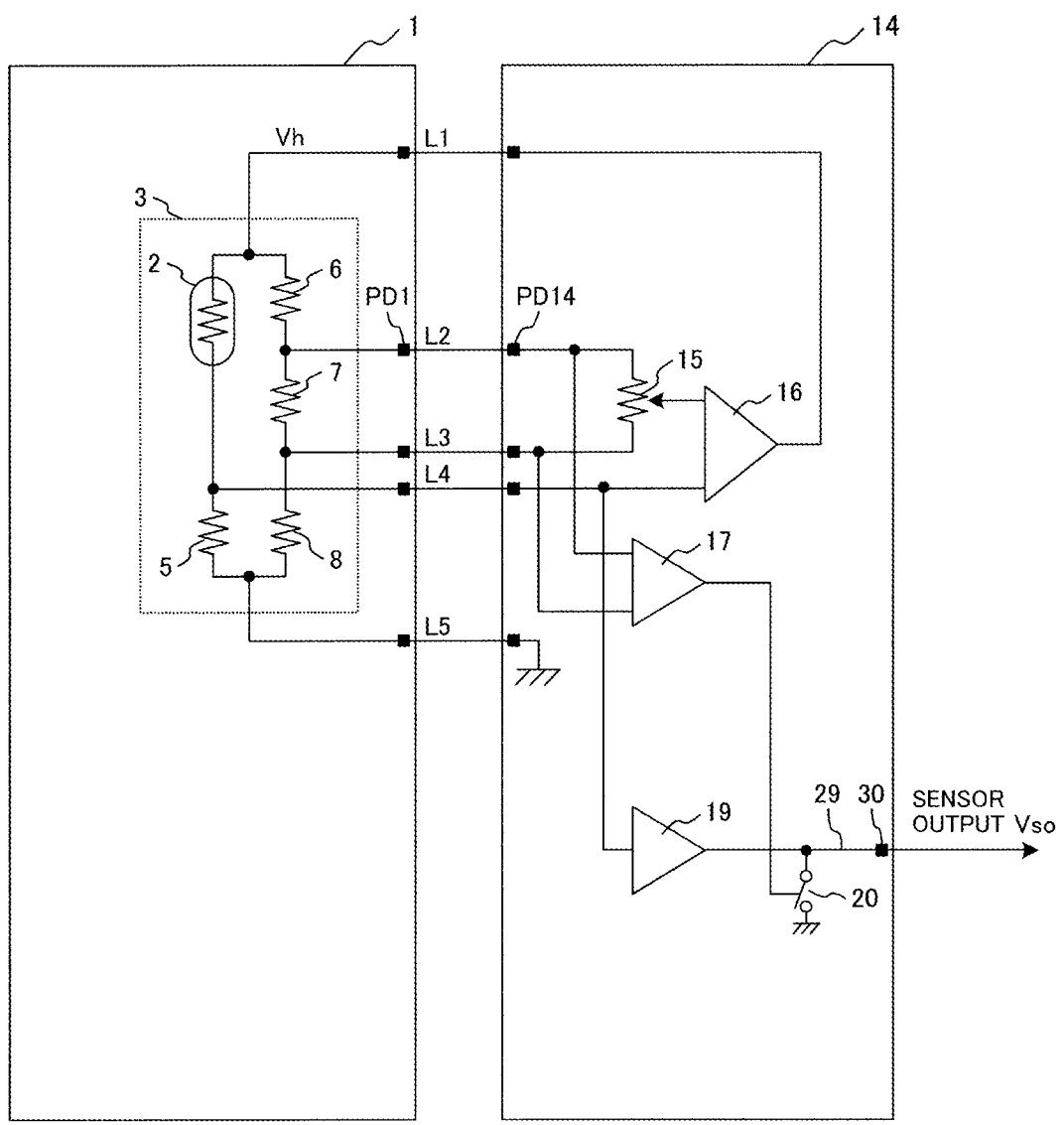
FIG. 12 is a drawing illustrating the configuration of a thermal flow meter in a fifth embodiment.

A description will be given to a thermal flow meter in a fifth embodiment of the present invention with reference to FIG. 12. FIG. 12 illustrates the configuration of a thermal flow meter in the fifth embodiment.

The thermal flow meter in the fifth embodiment is basically identical with the thermal flow meter in the fourth embodiment in configuration. A difference is as follows: a current passed through the heating element 2 is detected from the end-to-end voltage of the fixed resistor 5; and this end-to-end voltage is taken out by the amplifier 19 to obtain a sensor output. Also in the embodiment, breaks in the wire L2 and the wire L3 can be detected as in the first embodiment. Cases where the wire L1 or L5 is broken or the amplifier 16 becomes faulty and drive voltage Vh is zeroed can also be detected.

Figure 13:
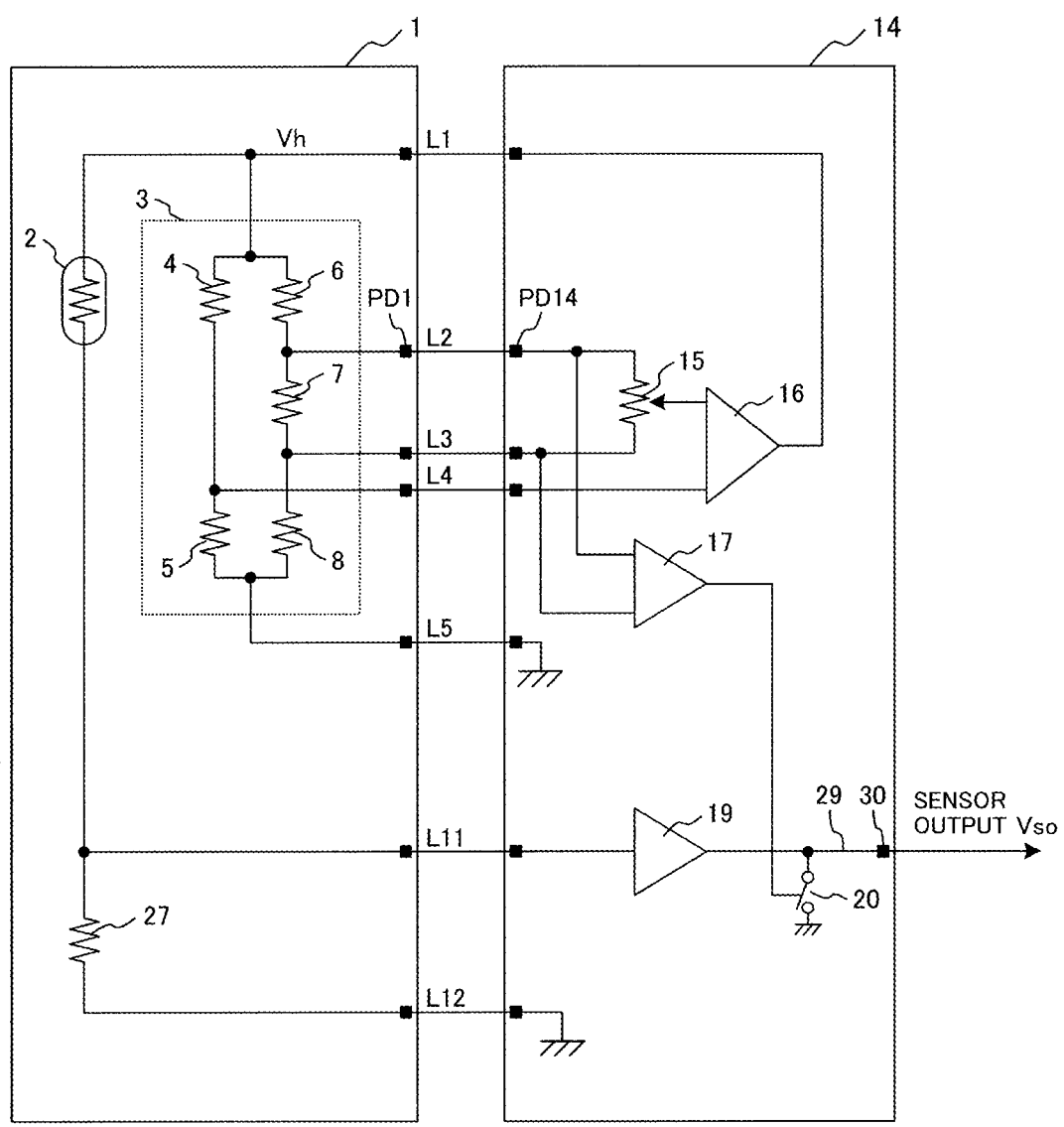
FIG. 13 is a drawing illustrating the configuration of a thermal flow meter in a sixth embodiment.

A description will be given to a thermal flow meter in a sixth embodiment of the present invention with reference to FIG. 13. FIG. 13 illustrates the configuration of a thermal flow meter in the sixth embodiment.

The thermal flow meter in the sixth embodiment is basically identical with the thermal flow meter in the first embodiment in configuration. A difference is as follows: a fixed resistor 27 is connected to the heating element 2 and a current passed through the heating element 2 is detected from the end-to-end voltage of the fixed resistor 27; and this end-to-end voltage is taken out by the amplifier 19 to obtain a sensor output. Also in this embodiment, breaks in the wire L2 and the wire L3 can be detected as in the first embodiment. Cases where the wire L1 or L5 is broken or the amplifier 16 becomes faulty and drive voltage Vh is zeroed can also be detected.

Figure 14:
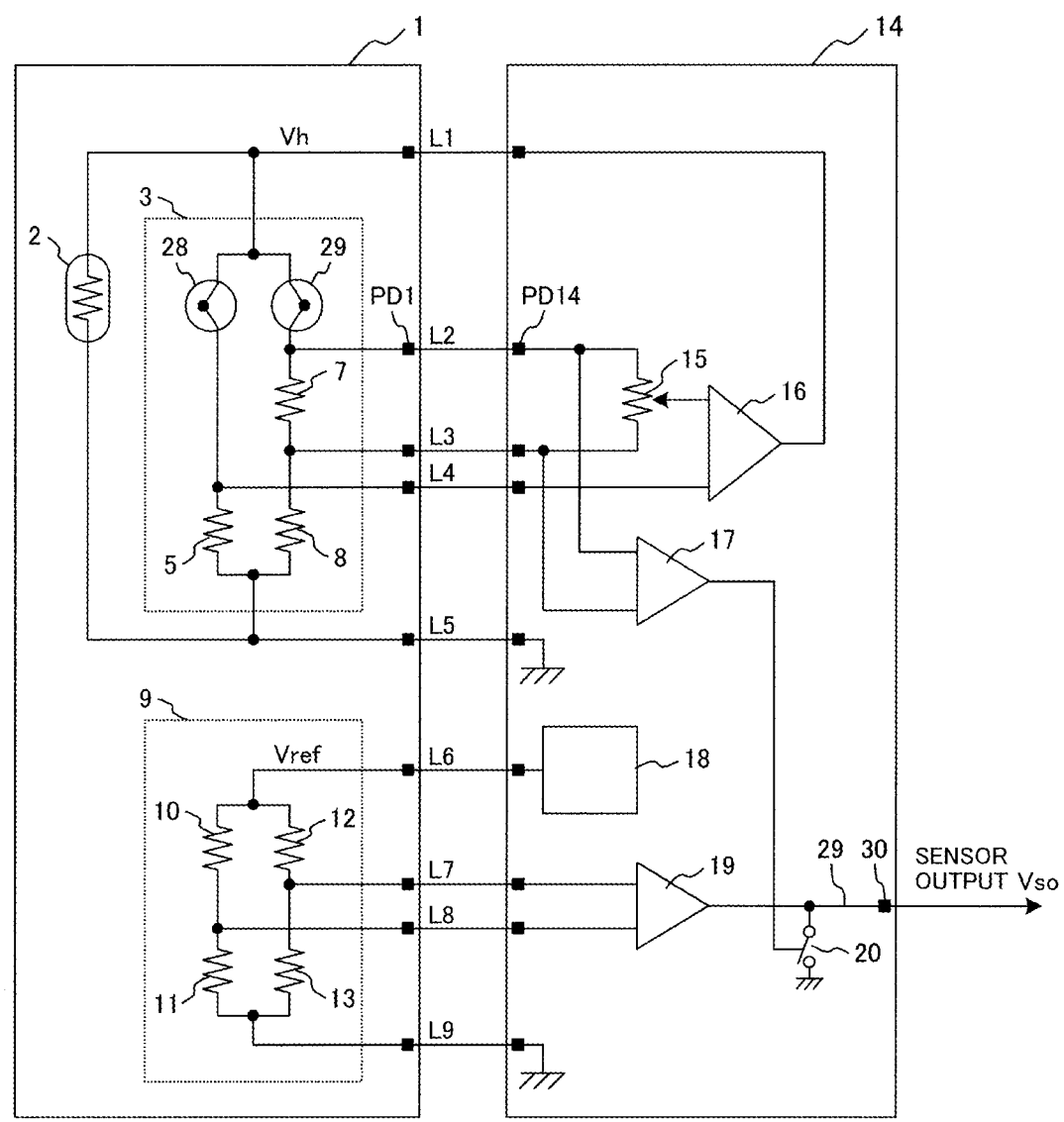
FIG. 14 is a drawing illustrating the configuration of a thermal flow meter in a seventh embodiment.

A description will be given to a thermal flow meter in a seventh embodiment of the present invention with reference to FIG. 14. FIG. 14 illustrates the configuration of a thermal flow meter in the seventh embodiment.

The thermal flow meter in the seventh embodiment is basically identical with the thermal flow meter in the first embodiment in configuration. A difference is as follows: a thermocouple 28 is placed instead of the heater temperature detecting resistor 4 to detect the temperature of the heating element 2; and a thermocouple 29 is placed instead of the fixed resistor 6. Also in this embodiment, breaks in the wire L2 and the wire L3 can be detected as in the first embodiment. Cases where the wire L1 or L5 is broken or the amplifier 16 becomes faulty and drive voltage Vh is zeroed can also be detected.

REFERENCE SIGNS LIST

1 . . . sensor element portion
2 . . . heating element
3 . . . heater temperature detecting bridge circuit
4 . . . heater temperature detecting resistor
5 . . . fixed resistor
6 . . . fixed resistor
7 . . . balance adjusting resistor
8 . . . fixed resistor
9 . . . temperature difference detecting bridge circuit
10 . . . temperature detecting resistor
11 . . . temperature detecting resistor
12 . . . temperature detecting resistor
13 . . . temperature detecting resistor
14 . . . integrated circuit
15 . . . tapped adjusting resistor
16 . . . amplifier
17 . . . comparator
18 . . . reference voltage source
19 . . . amplifier
20 . . . switch
21 . . . fixed resistor
22 . . . switch
23 . . . fixed resistor
24 . . . comparator
25 . . . OR-circuit
26 . . . digital output circuit
27 . . . fixed resistor
28 . . . thermocouple
29 . . . thermocouple

The invention claimed is:

1. A thermal flow meter comprising:
a sensor element portion including:
   a heating element;
   a temperature detecting bridge circuit that includes a plurality of resistors and is configured to detect a temperature of the heating element, wherein at least one of the plurality of resistors is a balance adjusting resistor that has a resistance value that varies according to the temperature of the heating element; and
an integrated circuit including:
   a tapped adjusting resistor connected in parallel with the balance adjusting resistor of the temperature detecting bridge circuit by two wires drawn from both ends of the balance adjusting resistor to take out an end to end voltage thereof whereby the thermal flow meter operates inaccurately by not taking out the end to end voltage of the balance adjusting resistor when one of the two wires is broken;
   a voltage detection circuit that detects that the magnitude of voltage produced between the two wires has become smaller than a first predetermined value; and
   a fault signal output circuit that, when the magnitude of the voltage is detected to become smaller than the first predetermined value at the voltage detection circuit, outputs a signal indicating a break of at least one of the two wires.

2. The thermal flow meter according to claim 1, wherein the fault signal output circuit outputs a signal indicating a fault through an output signal line for outputting a flow rate signal.

3. The thermal flow meter according to claim 2, wherein the fault signal output circuit brings the output signal line to the ground potential or the supply voltage and outputs a signal indicating a fault.

4. The thermal flow meter according to claim 2, wherein the fault signal output circuit uses a digital value out of a range of numeric values indicating a flow rate to output a signal indicating a fault.

5. The thermal flow meter according to claim 2, wherein the temperature detecting bridge circuit is provided with a power supply that applies a drive voltage having a constant voltage value.

6. The thermal flow meter according to claim 2,
wherein the voltage detection circuit has a second predetermined value larger than the first predetermined value as the value of voltage produced between the two wires, and
wherein the fault signal output circuit outputs a signal indicating a fault when the voltage detected at the voltage detection circuit has a voltage value larger than the second predetermined value.

7. The thermal flow meter according to claim 2, comprising:
a circuit that, when the magnitude of voltage produced between the two wires is detected to become smaller than the first predetermined value at the voltage detection circuit, brings the drive voltage of the heating element to a low voltage.

* * * * *